US006171405B1

(12) United States Patent
Lee

(10) Patent No.: US 6,171,405 B1
(45) Date of Patent: *Jan. 9, 2001

(54) METHODS OF REMOVING CONTAMINANTS FROM INTEGRATED CIRCUIT SUBSTRATES USING CLEANING SOLUTIONS

(75) Inventor: Moon-hee Lee, Kyungki-do (KR)

(73) Assignee: Samsung Electronics Co., Ltd. (KR)

( * ) Notice: Under 35 U.S.C. 154(b), the term of this patent shall be extended for 0 days.

This patent is subject to a terminal disclaimer.

(21) Appl. No.: 09/467,709

(22) Filed: Dec. 20, 1999

Related U.S. Application Data

(60) Continuation of application No. 09/211,673, filed on Dec. 14, 1998, now Pat. No. 6,043,206, which is a division of application No. 08/920,056, filed on Aug. 26, 1997, now abandoned, which is a continuation-in-part of application No. 08/778,135, filed on Jan. 2, 1997, now Pat. No. 5,789,360.

(30) Foreign Application Priority Data

Oct. 19, 1996  (KR) .................................................. 96-47006

(51) Int. Cl.$^7$ ................................ B08B 3/08; C23G 1/02; C11D 3/06; C11D 3/02
(52) U.S. Cl. ..................................... 134/3; 134/2; 134/38; 134/41; 134/42; 510/175; 510/176; 510/178; 510/465; 510/467
(58) Field of Search ..................................... 510/175, 176, 510/178, 465, 467; 134/2, 3, 38, 41, 42

(56) References Cited

U.S. PATENT DOCUMENTS

| | | | |
|---|---|---|---|
| 3,811,974 | 5/1974 | Squillace et al. ...................... | 156/17 |
| 3,859,222 | 1/1975 | Squillace et al. ..................... | 252/79.3 |
| 3,979,238 | 9/1976 | Justice ....................................... | 156/3 |
| 4,004,957 | 1/1977 | Quintana ............................... | 156/643 |
| 4,014,715 | 3/1977 | Preston .................................. | 134/3 X |
| 4,175,011 | 11/1979 | Spiliotis .................................. | 204/15 |
| 4,230,522 | * 10/1980 | Martin et al. ......................... | 156/638 |
| 4,671,851 | 6/1987 | Beyer et al. .......................... | 156/645 |
| 4,828,743 | 5/1989 | Rahfield et al. ....................... | 252/87 |
| 4,910,155 | 3/1990 | Cote et al. ................................ | 437/8 |
| 4,944,836 | 7/1990 | Beyer et al. .......................... | 156/645 |
| 5,058,799 | 10/1991 | Zsamboky ............................ | 228/124 |
| 5,389,194 | 2/1995 | Rostoker et al. ..................... | 156/636 |
| 5,411,595 | 5/1995 | Bokisa, Sr. et al. ..................... | 134/2 |
| 5,460,694 | 10/1995 | Schapira et al. ..................... | 216/104 |
| 5,523,513 | 6/1996 | Milner et al. ............................ | 588/1 |
| 5,637,252 | 6/1997 | Johnson et al. ....................... | 134/3 X |
| 5,669,980 | 9/1997 | McNeil et al. ........................... | 134/3 |
| 5,683,816 | 11/1997 | Goodreau ............................. | 428/461 |
| 5,789,360 | * 8/1998 | Song et al. ........................... | 510/175 |
| 6,043,206 | * 3/2000 | Song et al. ........................... | 510/175 |

FOREIGN PATENT DOCUMENTS

| | | |
|---|---|---|
| 153027 | 12/1981 | (DE) . |
| 795628 A1 | 9/1997 | (EP) . |
| WO 97/27001 | 7/1997 | (WO) . |
| WO 97/41278 | 11/1997 | (WO) . |

* cited by examiner

Primary Examiner—Necholus Ogden
Assistant Examiner—Brian P. Mruk
(74) Attorney, Agent, or Firm—Myers Bigel Sibley & Sajovec, P.A.

(57) ABSTRACT

Cleaning solutions for removing contaminants from integrated circuit substrates comprise fluoroboronic acid and phosphoric acid. Methods of removing contaminants from integrated circuit substrates comprise contacting the substrates with cleaning solutions comprising fluoroboronic acid and phosphoric acid. The integrated circuit substrates are then contacted with aqueous solutions.

6 Claims, 1 Drawing Sheet

METHODS OF REMOVING CONTAMINANTS FROM INTEGRATED CIRCUIT SUBSTRATES USING CLEANING SOLUTIONS

CROSS-REFERENCE TO RELATED APPLICATIONS

The instant application is a continuation application of Ser. No. 09/211,673 filed Dec. 14, 1998 now U.S. Pat. No. 6,043,206, which is a divisional application of Ser. No. 08/920,056 filed Aug. 26, 1997 now abandoned, which is a continuation-in-part application of Ser. No. 08/778,135 filed Jan. 2, 1997, now U.S. Pat. No. 5,789,360.

FIELD OF THE INVENTION

The present invention relates to cleaning solutions, and more particularly to cleaning solutions for use with integrated circuit substrates.

BACKGROUND OF THE INVENTION

An integrated circuit is typically fabricated by processing various thin films on a substrate. The thin films are usually formed, for example, through etching, ion implantation, and chemical mechanical polishing processes. During the above processes, contaminants such as sidewall polymers or fences may be produced, often as a result of the reaction between a conductive layer, a photoresist, and an etching gas typically used to process the conductive layer (e.g., an aluminum layer, a titanium layer, an aluminum—silicon layer, a tungsten layer, a tungsten—titanium layer, and a titanium-nitride layer). As a result, the yield and reliability of the ultimate product may be adversely impacted. Additionally, as the integration level of integrated circuit devices increases along with heightened production speeds, the presence of the above-mentioned contaminants may be disadvantageous. In view of the above, there is a perceived need to more effectively remove the contaminants from the devices.

FIGS. 1 and 2 describe a conventional cleaning method subsequent to: (1) a step for forming a contact hole which exposes a conductive layer by dry etching or (2) a step for patterning a conductive layer. Reference numeral 10 denotes a integrated circuit substrate such as a semiconductor substrate, reference numeral 20 denotes an interlayer insulation layer, reference numeral 30 denotes a conductive layer, reference numeral 30A denotes a conductive layer pattern, reference numeral 40 denotes an oxide layer, reference layer 50 denotes a contact hole, and reference numeral 60 denotes a contaminant. In particular, FIG. 1 illustrates semiconductor substrate 10 having a contact hole 50 formed thereon, which is conventionally cleaned with a photoresist stripper or an organic stripper.

Typically, contaminants such as etching-residues are removed from the sidewalls and bottom of the contact hole 50 by dipping the integrated circuit substrate in the conventional cleaning solution at a temperature ranging from 60° C. to 90° C. The conventional cleaning solution remaining on the surface of the semiconductor substrate may be removed by dipping the integrated circuit substrate into an alcohol-containing rinser, and then dipping the substrate into deionized water. Next, contaminants remaining on the surface of the integrated circuit substrate can be removed by dipping the substrate into a second deionized water bath. Thereafter, the substrate is usually spun to remove deionized water remaining on the surface of the substrate.

A number of problems may be associated with using a conventional cleaning solution. A conventional cleaning solution such as a photoresist stripper or an organic stripper may be limited in its ability to remove etching residues or other contaminants which can adhere to a surface of a contact hole. As a result, the cleaning may not be effective, and a portion of contaminant 60 can remain on the sidewalls and bottom of the contact hole as shown in FIG. 1. In particular, organometallic sidewall polymers are often oxidized into oxo-metallic complexes by a process of plasma ashing which is carried out in order to remove a photoresist. It is often difficult to effectively remove these oxo-metallic complexes using conventional cleaning solutions.

In addition, this conductive layer may be susceptible to corrosion as a result of using a conventional cleaning solution. Referring to FIG. 2, a conductive layer pattern 30A can be partially etched during the cleaning process, thus potentially deforming the profile of the conductive layer pattern. The corrosiveness of the cleaning solution may reduce the life spans of pipes and other cleaning equipment used in conjunction with the cleaning solutions. Additionally, a separate rinsing process may be required between the application of the cleaning solution and the deionized water rinsing process. As a result, manufacturing processes may become increasingly complex. Since a conventional cleaning solution itself may contain a sizeable number of metal ions and contaminants, the metal ions and contaminants may adhere to the surface of the integrated circuit substrate during the cleaning process.

Thus, there is a need in the art to address the problems associated with conventional cleaning solutions.

SUMMARY OF THE INVENTION

In one aspect, the invention relates to cleaning solutions for removing contaminants from integrated circuit substrates. The cleaning solutions comprise fluoroboronic acid and phosphoric acid.

In a second aspect, the invention relates to methods for removing contaminants from integrated circuit substrates. The methods comprise first contacting the integrated circuit substrates with cleaning solutions comprising fluoroboric acid and phosphoric acid. Subsequently, the integrated circuit substrates are contacted with aqueous solutions to remove the contaminants.

The invention provides potential advantages over conventional cleaning solutions and methods of using the same. For example, the cleaning solutions may allow for the selective removal of a number of contaminants with minimal corrosiveness to the integrated circuit substrates. Additionally, the methods of the invention may allow for the integrated circuit substrate to be cleaned using fewer steps that in conventional methods. As a result, increased productivity of integrated circuit substrates may be realized.

DETAILED DESCRIPTION OF THE PREFERRED EMBODIMENTS

Figure 1:
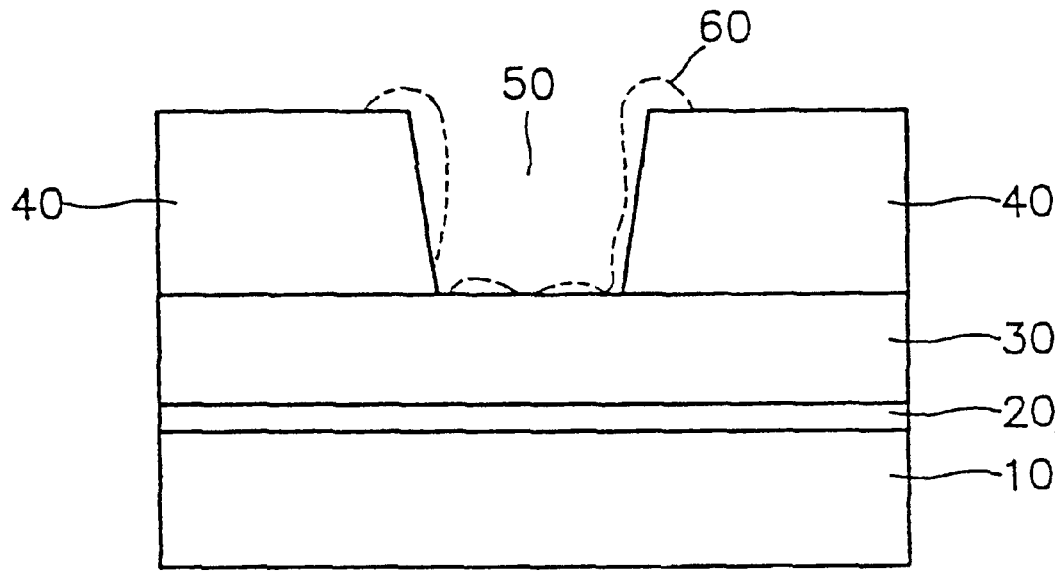
FIG. 1 is a sectional view of an integrated circuit substrate (e.g., semiconductor substrate) having a contact hole formed thereon, which is cleaned using a conventional cleaning solution such as a photoresist stripper or an organic stripper.
Figure 2:
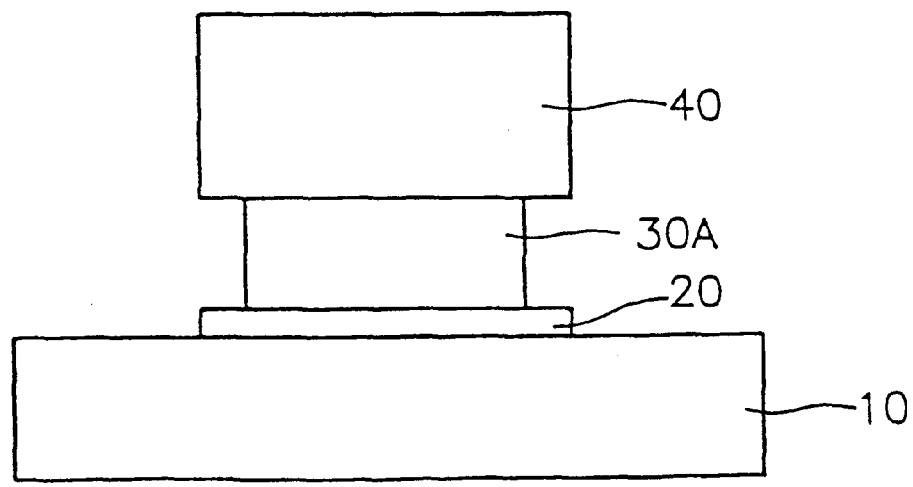
FIG. 2 is a sectional view illustrating a profile of a conductive layer pattern which has been subjected to a conventional cleaning process.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to being "on" another layer or substrate, it can be directly on the other layer or substrate, or intervening layers may also be present.

In one aspect, the invention relates to cleaning solutions for removing contaminants from integrated circuit substrates such as, but not limited to, semiconductor substrates. The cleaning solutions comprise fluoroboric acid and phosphoric acid.

Typically, the fluoroboric acid and phosphoric acid are present in aqueous-based solutions which are well mixed and present in the cleaning solutions. The fluoroboric acid and phosphoric acid solutions may be present in various purity levels. Preferably, the purities of the fluoroboric acid and phosphoric acid solutions each range from about 1 to about 55 percent.

The fluoroboric acid solutions and the phosphoric acid solutions may be present in varying amounts in the cleaning solutions. Preferably, the fluoroboric acid solutions are present in amounts ranging from about 0.01 to about 25 percent based on the weight of the phosphoric acid solutions.

The cleaning solutions of the present invention may also include surfactants in various amounts. Surfactants which may be used in the cleaning solutions include, for example, cationic, anionic, and non-ionic surfactants. Preferably, the surfactants are present in the cleaning solution in amounts ranging from about 0.001 to about 5 percent based on the weight of the phosphoric acid solutions.

In another aspect, the invention relates to methods for removing contaminants from integrated circuit substrates. The methods include contacting the integrated circuit substrates with cleaning solutions described herein. Typically, the integrated circuit substrates are contacted by dipping the substrates into baths which contain the cleaning solutions. The contacting steps are preferably carried out at temperatures ranging from about 20° C. to about 60° C.

Subsequently, the integrated circuit substrates are contacted by aqueous solutions which serve to remove the cleaning solutions from the integrated circuit substrates, more particularly, the substrate surfaces. Preferably, the aqueous solutions employed in these steps comprise deionized water.

The methods of the invention may also comprise additional steps. For example, the methods can include contacting (e.g., dipping) the integrated circuit substrates in second aqueous solutions subsequent to the step of contacting the substrates in the aqueous solutions. These steps are usually carried out to remove contaminants which may remain on the integrated circuit substrate surfaces. The second aqueous solutions preferably comprise deionized water.

Next, the substrates may be dried to remove any aqueous solution from the integrated circuit substrate surfaces. The drying step may be carried out by employing techniques known to those skilled in the art.

A number of contaminants may be removed from the integrated circuit substrates by the cleaning solutions of the invention. Such contaminants include, but are not limited to, polymers, metallic materials, oxide films, etching residues, and mixtures thereof. In particular, the cleaning solutions (and more specifically, the fluoroboric acid) may be effective at removing organometallic polymers, especially oxometallic polymers.

The cleaning solutions of the invention may present a number of advantages relative to conventional cleaning solutions. For example, the presence of the fluoroboric acid may aid in minimizing corrosiveness to conductive layers which are contacted by the cleaning solutions. Additionally, the presence of the fluoroboric acid facilitates removal of oxide films which may become damaged during etching processes.

The presence of the phosphoric acid in the cleaning solutions also may be advantageous. For example, although Applicants do not wish to be bound by any theory, it is believed that the phosphoric acid forms a coordinate bond with a metal contaminant as set forth in the formula below:

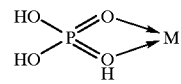

wherein M represents the metal contaminant. As a result, potential adverse effects of the metal contaminants on the integrated circuit substrates may be minimized.

The presence of surfactants in the cleaning solutions may also present advantages. For example, the surfactants may minimize the re-adherence of metal contaminants to the integrated circuit substrates after the cleaning solutions have been applied to the substrates.

In summary, the cleaning solutions of the invention may allow for the selective removal of organometallic polymers and metal contaminants from integrated circuit substrates. Specifically, the cleaning solutions may also effectively remove hardened polymers typically produced when polyimides are used in photoresists. The cleaning solutions may also be more cost effective to produce relative to conventional cleaning solutions.

The methods of using the cleaning solutions of the invention may also be advantageous relative to conventional cleaning methods. For example, the methods may not require a step for rinsing substrates with rinsers to remove the cleaning solutions. Accordingly, the cleaning times may be reduced and increased productivities may be experienced. Additionally, the methods may be carried out at lower temperatures (preferably between about 20° C. to about 60° C.) relative to conventional cleaning methods, which are typically carried out from 60° C. to 90° C. As a result, it may be easier to set and maintain the temperature conditions relative to conventional cleaning methods. Additionally, the time required to replace the cleaning solutions may be reduced and the equipment operation rate may be increased.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for removing contaminants from an integrated circuit substrate, said method comprising:
    contacting a surface of the integrated circuit substrate with an aqueous cleaning composition consisting of water, fluoroboric acid, a surfactant, and phosphoric acid at a temperature ranging from about 20° C. to about 60° C.

2. A method according to claim 1, wherein the fluoroboric acid is present in an amount ranging from about 0.01 to about 25 percent based on the weight of the phosphoric acid.

3. A method according to claim 1, wherein the surfactant is present in an amount ranging from about 0.001 to about 5 percent based on the weight of the phosphoric acid.

4. A method according to claim 3, wherein the fluoroboric acid is present in an amount ranging from about 0.01 to about 25 percent based on the weight of the phosphoric acid.

5. A method according to claim 1, further comprising the steps of:

contacting the integrated circuit substrate with a first deionized water; and drying the integrated circuit substrate;

wherein said steps of contacting the integrated circuit substrate with a first deionized water and drying the integrated circuit substrate are performed subsequent to said step of contacting the surface of the integrated circuit substrate with an aqueous cleaning composition.

6. A method according to claim 5, further comprising the step of:

contacting the integrated circuit substrate with a second deionized water;

wherein said step of contacting the integrated circuit substrate with a second deionized water is performed prior to said drying step.

\* \* \* \* \*